United States Patent
Hao et al.

(10) Patent No.: US 10,830,832 B2
(45) Date of Patent: Nov. 10, 2020

(54) EVENT DIRECTION IN LINE SENSORS

(71) Applicant: Schweitzer Engineering Laboratories, Inc., Pullman, WA (US)

(72) Inventors: Kei Hao, Pullman, WA (US); Naiden K. Spasov, Wauconda, IL (US); Armando Guzman-Casillas, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 288 days.

(21) Appl. No.: 15/967,261

(22) Filed: Apr. 30, 2018

(65) Prior Publication Data

US 2019/0331722 A1 Oct. 31, 2019

(51) Int. Cl.
*G01R 31/50* (2020.01)
*G01R 19/175* (2006.01)
*G01R 25/00* (2006.01)

(52) U.S. Cl.
CPC .......... *G01R 31/50* (2020.01); *G01R 19/175* (2013.01); *G01R 25/00* (2013.01)

(58) Field of Classification Search
CPC ...... G01R 31/50; G01R 19/175; G01R 25/00; G01R 31/085; G01R 31/083; G01R 19/2513
See application file for complete search history.

(56) References Cited

U.S. PATENT DOCUMENTS

| | | | |
|---|---|---|---|
| 8,599,523 B1* | 12/2013 | Ostrovsky | G08B 21/185 361/45 |
| 9,250,282 B2 | 2/2016 | Ukil et al. | |
| 9,366,715 B2 | 6/2016 | Ukil et al. | |
| 9,678,114 B2* | 6/2017 | Shamir | G01R 21/133 |
| 9,899,877 B2* | 2/2018 | Mitcheson | H02J 5/005 |
| 2003/0099070 A1* | 5/2003 | Macbeth | H02H 1/0015 361/5 |
| 2007/0226602 A1* | 9/2007 | Kirmser | G01R 31/31725 714/798 |
| 2013/0141827 A1 | 6/2013 | Ukil et al. | |
| 2013/0221977 A1 | 8/2013 | Ukil et al. | |
| 2014/0200843 A1* | 7/2014 | Shamir | G01R 21/133 702/107 |

(Continued)

OTHER PUBLICATIONS

IntelliCap® 2000 Automatic Capacitor Control, Instruction Sheet 1024-540, S&C Electric Company, Aug. 2019.

(Continued)

*Primary Examiner* — Mohammad K Islam
(74) *Attorney, Agent, or Firm* — Bradley W. Schield

(57) ABSTRACT

The present disclosure relates to directionality of events on line sensors for power lines. In an embodiment, a line sensor may include phase detection circuitry that detects a feature of an operating parameter of a power line prior to an occurrence of an event. The phase detection circuitry may provide a time associated with the feature. The line sensor may include sensor circuitry that sends an activation signal. The line sensor may include a controller that, upon receiving the activation signal, measures samples of the operating parameter. The line sensor may determine a relative direction of the event based on the plurality of times detected prior to the event and the measured samples of the operating parameter.

25 Claims, 7 Drawing Sheets

(56) References Cited

U.S. PATENT DOCUMENTS

| | | | |
|---|---|---|---|
| 2015/0293164 A1* | 10/2015 | Stephenson | G01R 31/42 324/509 |
| 2015/0309105 A1* | 10/2015 | Ostrovsky | H02H 3/335 324/509 |
| 2016/0187409 A1* | 6/2016 | Kolker | H02H 3/20 361/42 |
| 2016/0187410 A1* | 6/2016 | Kolker | G01R 31/50 361/42 |
| 2016/0202321 A1* | 7/2016 | Drame | G01R 31/3277 324/424 |
| 2016/0245850 A1* | 8/2016 | Kasztenny | G01R 23/02 |
| 2018/0292447 A1* | 10/2018 | Piyasinghe | G01R 21/133 |
| 2019/0037515 A1* | 1/2019 | Shamir | H04J 3/0664 |
| 2019/0123668 A1* | 4/2019 | Da Costa | H02H 7/08 |

OTHER PUBLICATIONS

Ukil, Abhisek, et al., "Current-Only Directional Overcurrent Relay". IEEE Sensors Journal, Nov. 22, 2010, vol. 11, Issue 6.

Ukil, Abhisek, et al., "Current-Only Directional Overcurrent Protection for Distribution Automation: Challenges and Solutions". IEEE Transactions on Smart Grid, Aug. 22, 2012, vol. 3, Issue 4.

* cited by examiner

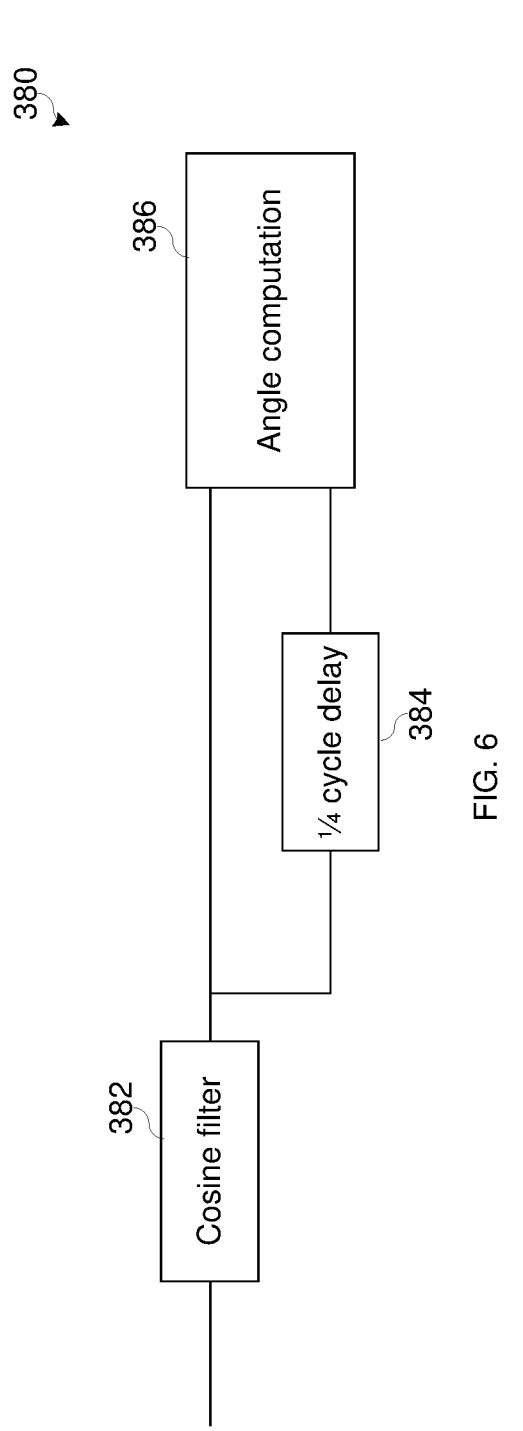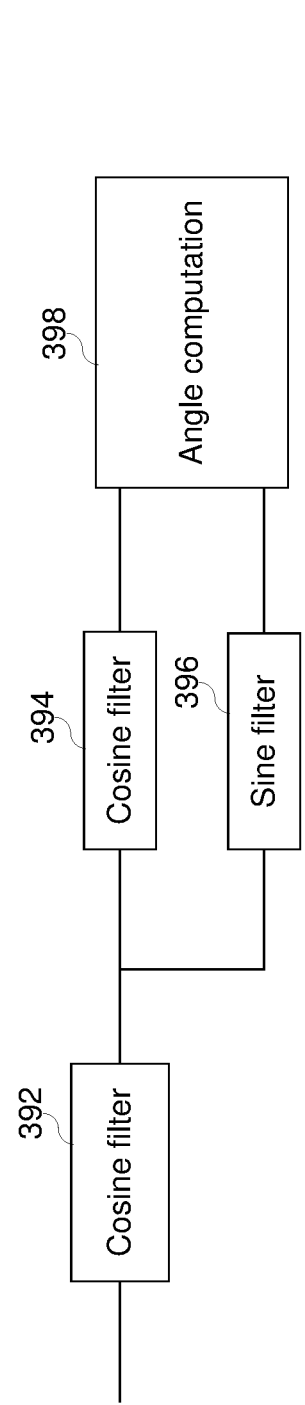
FIG. 6
FIG. 7

EVENT DIRECTION IN LINE SENSORS

TECHNICAL FIELD

The present disclosure relates generally to electric power delivery systems and, more particularly, to determining event direction in electric power delivery systems using power line sensors.

BRIEF DESCRIPTION OF THE DRAWINGS

Non-limiting and non-exhaustive embodiments of the disclosure are described herein, including various embodiments of the disclosure with reference to the figures listed below.

FIG. 6 is a flow diagram of a process performed for determining phase shift between an expected current prior to an event and current measured following the event.

FIG. 7 is a flow diagram of another process performed by the processor for determine the phase shift between the expected current prior to the event and the current measured following the event.

DETAILED DESCRIPTION OF SPECIFIC EMBODIMENTS

Figure 1:
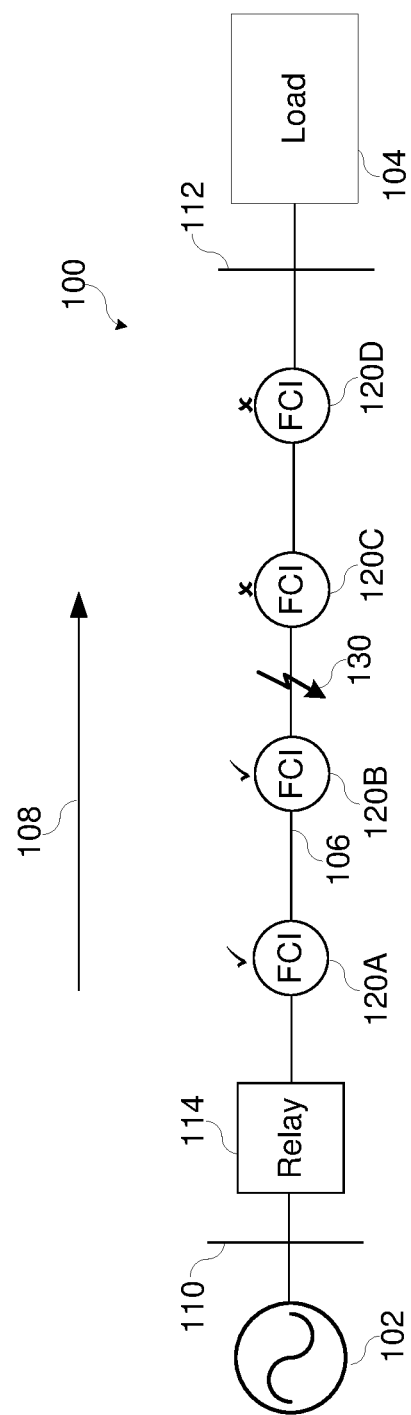
FIG. 1 is a one-line diagram of a power system having line sensors, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power lines may be used to provide electrical energy from a source (such as, for example, a utility source, a generator, a distributed generator, or the like) to one or more loads. Power lines may be overhead lines or underground lines that include one or more conductors to conduct electricity between the source and the loads. In some cases, an event, such as a fault, may occur. These events may be caused by various environmental conditions, such as wind, falling trees, or lightening, between the utility and the loads. Wireless line sensors, such as faulted circuit indicators (FCIs), may detect events on power lines and provide notifications regarding the events. For instance, FCIs may detect an overcurrent, an undercurrent, an undervoltage, an overvoltage, a loss of current, and the like, caused by the event (e.g. a fault) to detect the occurrence of the event.

Over time, power distribution systems have become increasingly bi-directional. That is, more than one source may be connected to the power lines to provide power to the loads. During an event (e.g. a fault), power may backfeed from a second source, such as a distributed generator supporting local loads. The bi-directionality of power may cause difficulties in determining the direction of the event (e.g. a fault) because power may continue to backfeed from the second source into the power system, thereby causing line sensors on both sides of the event (e.g. a fault) to indicate flow of current.

In some embodiments, line sensors may be wireless (e.g., FCIs). Wireless line sensors may use harvested energy and/or stored energy to perform operations, for example, without being directly electrically coupled to the power grid. Because wireless line sensors may have limited power harvesting and/or power storage capabilities, the wireless line sensor may not perform repeated (e.g., continuous) sampling of the current waveform on the power line during normal operations. In other embodiments, line sensors may perform the operations described herein to conserve power.

Systems and methods to determine event direction in line sensors are described below. In an embodiment, a wireless line sensor may include sensing circuitry that detects an operating parameter, such as current or voltage, of the power line. The wireless line sensor may determine a feature, such as a zero crossing of the operating parameter. From the zero crossing, the wireless line sensor may determine an expected zero crossing. If an event occurs, the wireless line sensor may determine a measured zero crossing. The processor may compare the expected zero crossing to the measured zero crossing.

The systems and methods described herein may improve line sensor technology by providing the additional functionality of determining directionality of an event even under conditions in which the power is bi-directional. Further, by sampling at specific intervals, the line sensor may conserve power, for example, over implementations that determine and/or generate waveforms of the monitored characteristic prior to or independently from events.

FIG. 1 illustrates a simplified one-line diagram of an embodiment of a radial electric power transmission and distribution system 100 in which power is distributed radially from a source 102, such as an electrical utility 102, towards one or more loads 104 via one or more power lines 106. The power from the source 102 may be delivered radially such that power is provided in a single direction 108 (e.g., from source 102 to load 104) on the power line 106. The radial electric power transmission and distribution system 100 may include one or more busses 110 and 112 to distribute power.

In some cases, an event 130 may occur causing power to not reach the loads in the desired state. For instance, overhead lines may be subject to various environmental conditions, such as wind, falling trees, lightening, or animals that may cause an event between the utility and/or the loads. In such cases, the electric power transmission and distribution system 100 may include a relay 114 that electrically disconnects a portion of the power line 106 from the source 102 to stop providing electric power to the event 130 while a cause of the event 130 is determined.

To locate the event 130, line sensors 120A, 120B, 120C, and 120D, such as faulted circuit indicators (FCIs), may be used to detect the event and to provide an indication of the occurrence of the event. For example, FCIs may provide a visual indication or may send a radio signal to indicate detection of the event. In the radial electric power transmission and distribution system 100, the line sensors 120A, 120B, 120C, and 120D may enable a location of the event 130 to be determined. In the illustrated embodiment, the line sensors 120A and 120B detect (shown with a checkmark) an overflow of current while line sensors 120C and 120D do not detect (shown with an x) an overflow of current. Because line sensors 120A and 120B provide an indication of the overflow of current and line sensors 120C and 120D do not provide such an indication, the location of the event 130 may be determined to be between the line sensors 120B and 120C. However, power transmission and distribution systems may not be radial, as in FIG. 1. Instead, power distribution systems may be bi-directional in which power may be distributed in each direction or in both directions on a power line at a given time. Further, as explained below, radial systems may operate as bi-directional systems depending on the loads.

Figure 2:
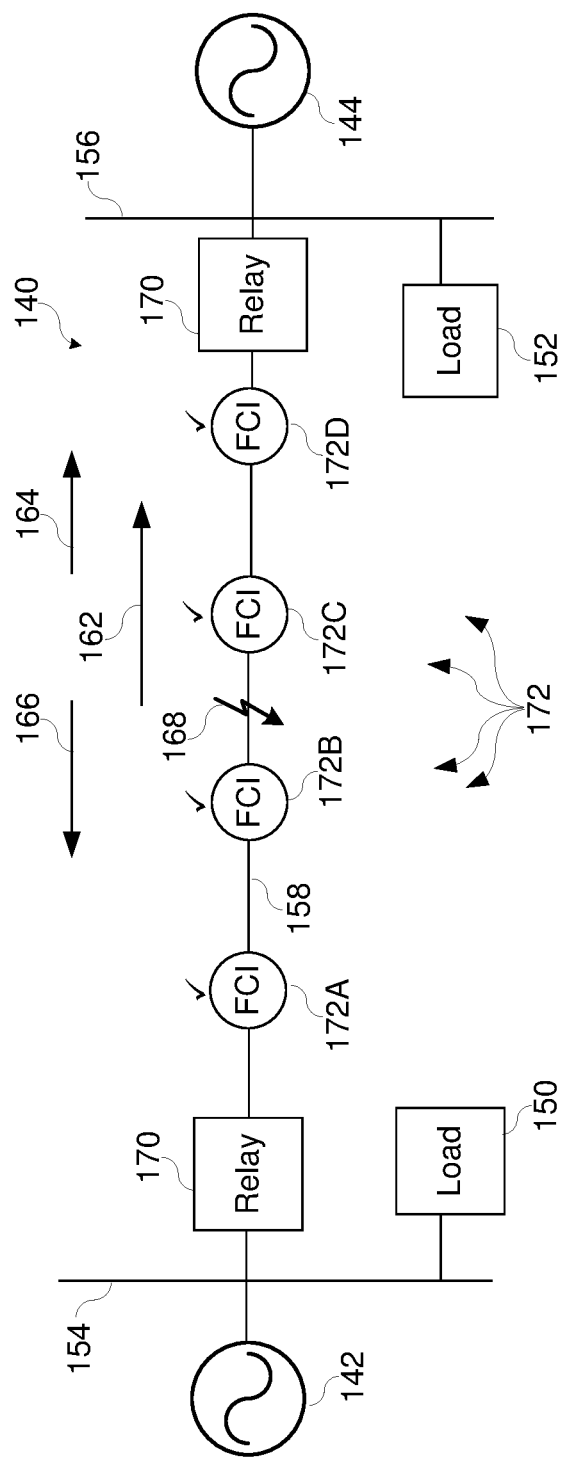
FIG. 2 is a one-line diagram of another power system having line sensors on a power line, in accordance with an embodiment.

FIG. 2 illustrates a simplified one-line diagram of an embodiment of a bi-directional electric power transmission and distribution system 140 in which power is distributed from a first source 142, such as an electrical utility, and from a second source 144, such as another electrical utility, a wind turbine, a grid-connected photovoltaic system, and the like. Each of the first source 142 and the second source 144 may provide power to loads 150 and 152 via one or more busses 154 and 156 and one or more power lines 158. That is, the first source 142 may provide power to the load 150 via the bus 154 and provide power to the load 152 through the power line 158 and the busses 154 and 156, and the second source 144 may provide power to the load 152 via the bus 156 and provide power to the load 150 through the power line 158 and the busses 154 and 156. Similar to the radial system described with respect to FIG. 1, the bi-directional electric power transmission and distribution system 140 may include one or more relays 170 and/or one or more line sensors 172A, 172B, 172C, and 172D (e.g., FCIs), referred to generally as line sensors 172, which may perform similar operations to the respective relays and line sensors described with respect to FIG. 1.

Due to the bi-directionality of the electric power transmission and distribution system 140, the directionality of the power flow at a given location on the power line 158 may change dynamically based on operating configurations, conditions, and topology. Further, power from the first source 142 and the second source 144 may each provide power to during an event 168. For example, during the event 168, the line sensors 172A and 172B may indicate the occurrence of the event 168 due to detection of overcurrent from the first source 142 providing power to the event 168. Further, the line sensors 172C and 172D may indicate the occurrence of the event 168 due to detection of overcurrent from the second source 144. That is, each line sensor 172A, 172B, 172C, and 172D may indicate the occurrence of the event 168 due to overcurrent detected (shown with a checkmark) from the first source 142 and the second source 144 feeding power to the event 168.

Additionally, in the radial system described with respect to FIG. 1, the loads 104 may store energy that may be back fed to the event 130 to cause the line sensors 120C and 120D to indicate the occurrence of the event 130. For instance, the line sensors 120C and 120D may indicate the occurrence of the event 130 from an overcurrent caused by stored energy in momentum of one or more motors of the load 104 being delivered to the event 130. In each of these situations in which power is back fed to the event from the source 144 of FIG. 2 or from energy stored in the loads 104 of FIG. 1, it may be difficult to identify directionality of events with respect to line sensors. Because each of the line sensors may be detecting overcurrent, it may be desirable to detect the direction of the event (e.g. a fault).

Accordingly, systems and methods described below may improve line sensor technology by determining the relative direction of the event with respect a reference direction of current or voltage. Further, the systems may determine the relative direction without repeatedly (e.g., continuously) sampling the current magnitude sufficient amount to generate a current waveform. That is, upon detecting the event 168, the line sensors 172 may provide an indication of a relative direction of the event 168. For example, the line sensor 172 may determine a reference direction 162 of current during operation of the power line 158. Upon detecting the event 168, the line sensor 172 may then determine that the event 168 is in the same direction 164 as the reference direction 162 from the line sensor 172 or in the opposite direction 166 of the reference direction 162 from the line sensor 172. By determining the directionality of the event 168, power outage times may be reduced by enabling location of the event 168 within a shorter period of time than if directionality were not determined, thereby improving operation of the electric power transmission and distribution system 140.

Figure 3:
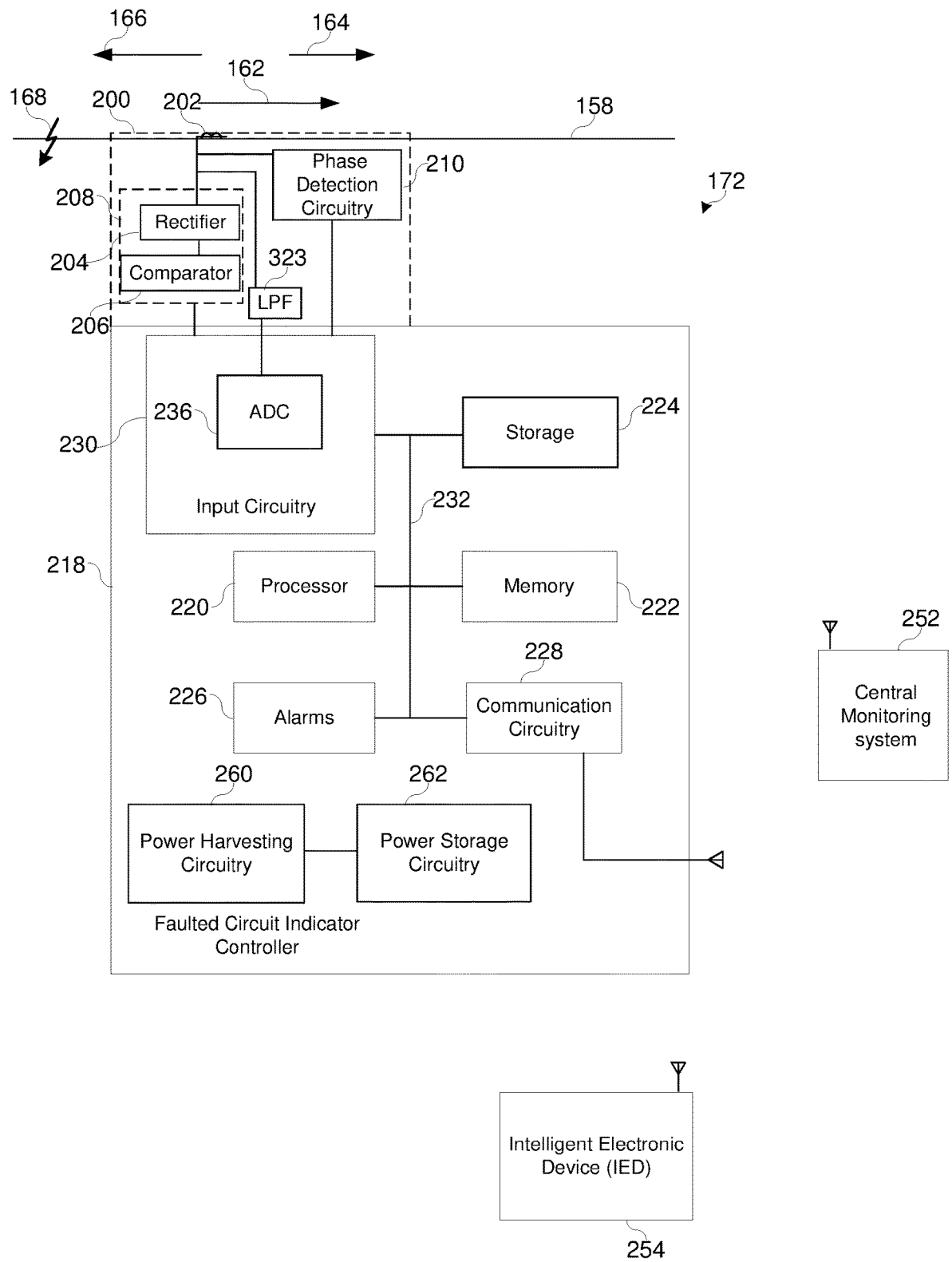
FIG. 3 is a block diagram of a line sensor of FIG. 2, in accordance with an embodiment.

FIG. 3 is a block diagram of a line sensor 172 on the power transmission and distribution system 140 that provides relative directionality of the event 168 on the power line 158 with respect to a reference direction 162 of current flow preceding the event 168 consistent with embodiments of the present disclosure. The line sensor 172 may refer to any of the line sensors 172A, 1726, 172C, and 172D coupled to the power line 158 discussed above. The line sensor 172 may include sensor circuitry 200, such as current sensor circuitry and/or voltage sensor circuitry, that senses an operating parameter of the power line 158. The sensor circuitry 200 may include one or more current transformers 202 operatively coupled to the power line 158 such that current through the power line 158 induces current through the current transformer 202 proportional to current through the power line 158. The sensor circuitry 200 may further include threshold detection circuitry 208 and phase detection circuitry 210. The threshold detection circuitry 208 may have a rectifier 204 that rectifies the current signals from the current transformer 202 and a comparator 206 electrically coupled to an output of the rectifier 204. The comparator 206 may compare the rectified signal to a threshold to detect an occurrence of the event 168. While current signals are used herein as an example of an operating parameter sensed via the sensor circuitry 200, current and/or voltage signals may be used as the operating parameter.

The line sensor 172 may include a controller 218, such as a microcontroller, having one or more processor(s) 220, memory 222 and/or nonvolatile storage 224, one or more alarms 226, communication circuitry 228, input circuitry 230, or any combination thereof. Each of the processor 220, the memory 222, the storage 224, the alarms 226, the communication circuitry 228, and the input circuitry 230 may be communicatively coupled by one or more communication busses 232. In the illustrated embodiment, the input circuitry 230 may receive the output from the comparator 206. For example, the comparator 206 may output a digital signal to the input circuitry 230 based on the comparison between the threshold and the rectified signal to indicate the occurrence of the event 168.

In the illustrated embodiment, the line sensor 172 includes one or more analog to digital (A/D) converters 236 that receive an analog signal from the current transformer 202 or another current transformer and convert the analog signal into a digital signal. The A/D converter 236 may multiplex, sample, and/or digitize the measured current and/or voltage signals to form corresponding digitized current and/or voltage signals. For example, the A/D converter 236 may monitor an analog signal indicative of the operating parameter on the power line 158 and output a digital signal representing the operating parameter on the power line 158.

The processor 220 and/or other data processing circuitry may be operably coupled with the memory 222 and/or the nonvolatile storage 224 to perform various operations. Such programs or instructions executed by the processor 220 may be stored in any suitable article of manufacture that may include one or more tangible, computer-readable media at least collectively storing the instructions or routines, such as the memory 222 and the nonvolatile storage 224. The memory 222 and the nonvolatile storage 224 may include any suitable articles of manufacture for storing data and executable instructions, such as random-access memory, read-only memory, rewritable flash memory, hard drives, or any other suitable optical, magnetic, or solid-state storage medium, or a combination thereof.

In some embodiments, the processor 220, the memory 222, and/or the nonvolatile storage 224 may be implemented as hardware components, such as via discrete electrical components, via a field programmable gate array (FPGA), and/or via one or more application specific integrated circuits (ASICs). The processor 220 may be embodied as one or more general-purpose microprocessors, one or more special-purpose microprocessors, a general purpose integrated circuit, an ASIC, an FPGA, and/or other programmable logic devices.

The input circuitry 230, such as the A/D converter 236, may be operatively coupled to the processor 220 (e.g., via the communication bus 232 or another bus), through which digitized representations of current and/or voltage signals may be transmitted to the processor 220. The processor 220 may analyze the event 168 based on the digitized representations of current using instructions stored in the memory 222. The processor 220 may then provide a signal indicating the occurrence of the event 168. In certain embodiments, the processor 220 may send a signal to the alarm 226 to indicate the event 168 occurrence. The alarm 226 may provide an audio alert, a visual alert (e.g., LEDs), or the like. The processor 220 may send a signal to the communication circuitry 228 to output a wireless signal to an electronic device to indicate that the event 168 has occurred or is ongoing. In some embodiments, the communication circuitry 228 may include a transceiver that receives and/or transmits data to enable the processor 220 to communicate with other electronic devices. For instance, the processor 220 may communicate, via a communication network with a central monitoring system 252, such as a supervisory control and data acquisition (SCADA) system and/or a wide area control and situational awareness (WACSA) system. The central monitoring system 252 may provide protective operations for the power transmission and distribution system.

The processor 220 may communicate, via a communication network and/or via direct radio signals sent by the transceiver, with one or more intelligent electronic devices (IEDs) 254. The IED 254 may be remote from the central monitoring system 252 and may communicate directly or over the communication network with the central monitoring system 252 and/or one or more other IEDs.

The line sensor 172 may include power harvesting circuitry 260 (e.g., current transformers coupled to the power line 158, photovoltaic cells, etc.) and/or power storage circuitry 262 (e.g., battery cells) to store, for example, the harvested energy. The power harvesting circuitry 260 and/or the power storage circuitry 262 may provide power to the line sensor 172 to enable the line sensor 172 to monitor the power line 158 and provide an indication of the event 168.

The line sensor 172 may be a wireless line sensor that is powered with the power harvesting circuitry 260 and/or the power storage circuitry 262. The power harvesting circuitry 260 of wireless line sensors may be limited in which the line sensor 172 is powered via the current transformer 202 or another current transformer without being directly electrically coupled to the power grid. That is, alternating current on the power line 158 may produce a magnetic field that magnetically induces alternating current in the current transformer 202 (e.g., through a core), harvested by the power harvesting circuitry 260, to power each of the operations of line sensor 172 without additional sources of power other than the power harvesting circuitry 260 and/or the power storage circuitry 262 (e.g., without directly conducting electrical energy via a conductor directly electrically coupled to the power grid). In other embodiments, the power harvesting circuitry 260 may harvest power via photovoltaic cells. The power storage circuitry 262 may include one or more battery cells, capacitors, supercapacitors, or the like, to store energy from the power harvesting circuitry 260 to power the line sensor 172. In some embodiments, the line sensor 172 may perform each of the operations described herein using power from the power harvesting circuitry 260 and/or power storage circuitry 262 without additional power sources.

Because power to perform operations may be limited on the line sensor 172 based on the power harvesting circuitry 260 and/or the power storage circuitry 262, it may be desirable for the line sensor 172 to conserve power. Line sensors that continuously monitor samples (e.g., sampling 3, 4, 5, 10, 20, or more samples within a period) of the current during normal operation may utilize significant power. As described below, embodiments consistent with the present disclosure may improve line sensor technology by determining a direction of the event without continuously monitoring the current during normal operations (e.g., operations prior to or without an event). By determining a direction of the event while limiting power consumption, additional functionality of the wireless line sensor technology may be enabled in which the line sensor 172 provides or stores an indication of the direction of the event.

The phase detection circuitry 210 may monitor a feature of the operating parameter, such as changes in the current or voltage. In the illustrated embodiment, the phase detection circuitry 210 may monitor a time at which a feature, such as a zero crossing of the current, a zero crossing of the voltage, a peak (e.g., maximum and/or minimum) of the current, or a peak (e.g., maximum and/or minimum) of the voltage, occurs.

The phase detection circuitry 210 may send an activation signal to activate (e.g., wake up) the controller 218 to enable the controller 218 to store a time stamp associated with each zero crossing. For example, the phase detection circuitry 210 may activate, via hardware interrupts, the controller 218 at each rising edge (e.g., from negative phase to positive phase) and/or falling edge (e.g., from positive phase to negative phase). Upon activation, the controller 218 may record a time stamp associated with the rising edge and/or falling edge and be deactivated until reactivated.

Prior to the event, the controller 218 may be in a sleep mode or in a low power mode, referred to herein as being in a pre-event mode, in which the controller 218 may not measure samples of the magnitude of the current on the power line 158 to conserve power. That is, the controller 218 may be activated to record time stamps of the zero crossing but may not sample the magnitude of the current or may otherwise be inactive in the pre-event mode. For instance, by being activated to record the time stamps of zero crossings (e.g., awake 60 times per second for a 60 hz signal). For example, the controller 218 may begin in an inactive state. Upon occurrence of a zero crossing, the phase detection circuitry 210 may send the activation signal to the controller 218 to activate the controller 220. The processor 220 may record a time stamp of the zero crossing based upon the activation signal and return to being inactive. The controller 218 may repeat this process while operating in the pre-event mode to conserve power by the controller 218 being inactive other than during the zero crossings.

The controller 218 may receive an event signal from the threshold detection circuitry 208 indicating the occurrence of the event 168 due to current exceeding a threshold. The controller 218 may activate upon receiving the event signal and operate in an event mode in which the controller 218 is active, awake, on, or in a high power mode that utilizes more power than the low power mode (e.g., due to being active for longer periods than when active in the pre-event mode) prior to the event. The controller 218 may then measure samples of the current of the power line 158. In some embodiments, the controller 218 may measure repeated samples (e.g., 8, 16, 32, or more samples), in the event mode, during or following the event 168 to analyze the event 168. That is, the controller 218 may not take any samples of current magnitude prior to the event 168 but may be active to record zero crossings and, upon receipt of the event signal, transition to the event mode and take repeated samples. In other embodiments, the controller 218 may take fewer samples prior to the occurrence of the event 168 than during the occurrence of the event 168. Further, the processor 220 may determine the times at which the zero crossings occurred from the activations by the phase detection circuitry 210 and store the times in the memory 222 and/or nonvolatile storage 224. Based on the zero crossings prior to the event 168 and the repeated samples during or following the event 168, the processor 220 may determine a relative direction of the event 168.

Figure 4:
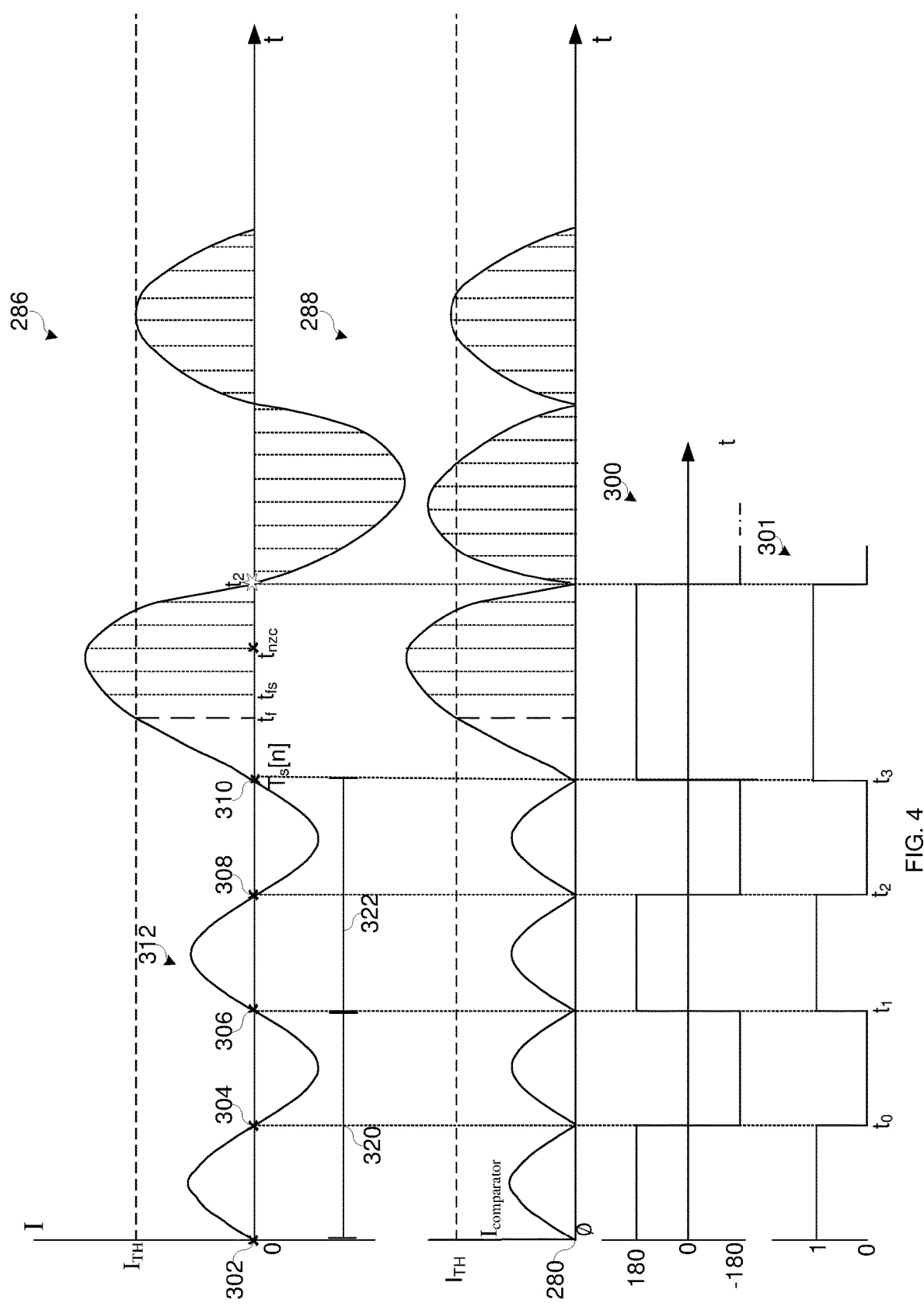
FIG. 4 is a set of plots of data received and/or analyzed at the line sensor of FIG. 3, in accordance with an embodiment.
Figure 5:
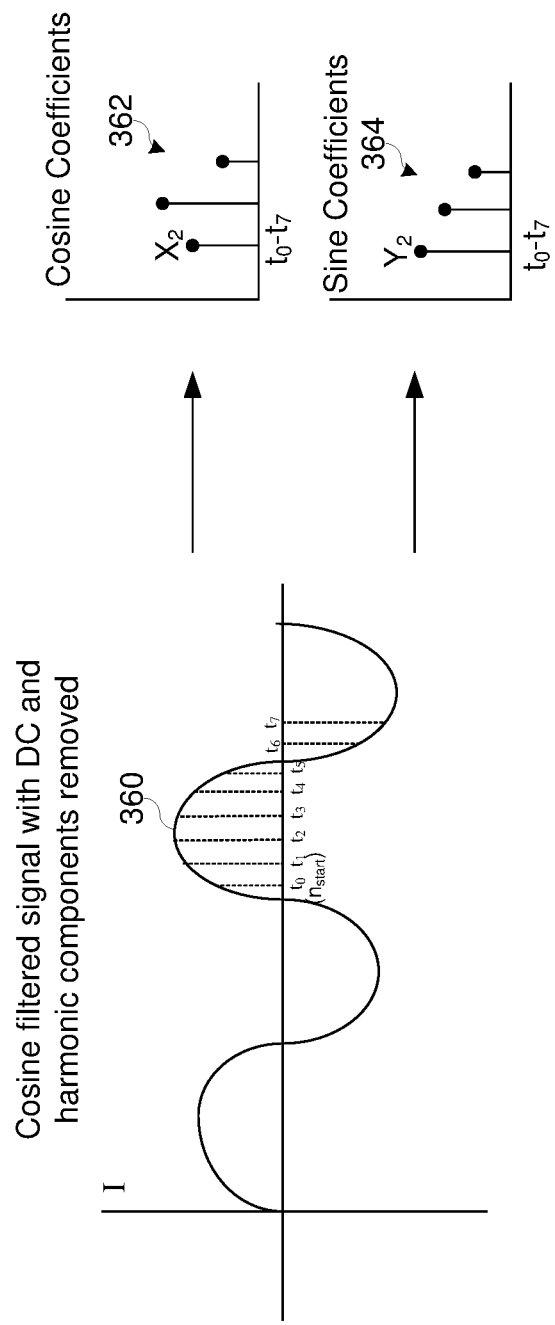
FIG. 5 is a set of plots of analysis of the data of FIG. 4, in accordance with an embodiment.

FIG. 4 illustrates a set of graphs of current and phase aligned with respect to time monitored by the line sensor 172. The set of graphs in FIGS. 4 and 5 are meant to be illustrative of concepts consistent with embodiments of the disclosure, and while the graphs are depicted visually, the line sensor 172 may process data from the sensor circuitry 200 and/or the phase detection circuitry 210 without generating the visual depiction of the graphs.

A first graph 286 shows current measurements obtained at the current sensor circuitry 200 representative of current through the power line 158 with respect to time. A second graph 288 illustrates the rectified current obtained at the comparator 206 to detect the occurrence of the event 168. A third graph 300 shows a signal analyzed via the phase detection circuitry 210 used to activate the controller 218 to obtain the time stamps of the zero crossings. A fourth graph 301 shows an activation signal sent from the phase detection circuitry 210 to the controller 218 to record the time stamps of the zero crossings. The phase detection circuitry 210 may detect the times at which the phase alternates directions at time stamps $t_0$, $t_1$, $t_2$, and $t_3$. Each of the time stamps $t_0$, $t_1$, $t_2$, and $t_3$ may be stored in memory 222 and/or the nonvolatile storage 224 the controller 218. In an embodiment, the phase detection circuitry 210 may send the activation signal to activate the controller 218 at each rising edge at time $t_1$ and $t_3$. In another embodiment, the phase detection circuitry 210 may send the activation signal to activate the controller 218 at each falling edge at time to and $t_2$.

The processor 220 may obtain a reference direction 162 in which power is being delivered or expected to be delivered on the power line 158. The reference direction 162 may be received via the communication circuitry 228 from another electronic device (e.g., IED 254, a central monitoring system 252, etc.) or may be determined in another manner (e.g., from a direction stored in memory). In the illustrated embodiment, upon detecting that the current exceeds the threshold, the processor 220 may retrieve the time stamps $t_1$ and $t_3$ of rising zero crossings of the pre-event current 312 from the memory 222 and/or the nonvolatile storage 224. The processor 220 may determine a period (or frequency) 320 and 322 of the pre-event current 312 based on the time stamps $t_1$ and $t_3$ the rising edge zero crossings 306, and 310. In an embodiment, the processor 220 may utilize a moving average filter to determine the period 320 and 322. For example, a low pass filter 323 having a moving average of time between each of the rising zero crossings may be implemented as follows $$T_{average}[n] = \frac{1}{4}(t_s[n] - t_s[n-4]) \qquad \text{Eq. 1}$$

where $t_s$ are the time stamps of the rising edge zero crossings of the nth sample. Note that while rising edge zero crossings are used as an example, falling edge or a combination of both may be used.

At time $t_f$, the sensor circuitry 200 may detect an occurrence of the event 168 by determining that measured current has exceeded a current threshold ($I_{TH}$). Upon determining that the measured current exceeds $I_{TH}$, the sensor circuitry 200 may send the event signal to the controller 218 to activate the controller 218 to operate in the event mode from operating in the pre-event mode. The processor 220 may begin repeatedly sampling the fault current for one or more cycles (e.g., 2.5 cycles, 3 cycles, 5 cycles, 6 cycles, 10 cycles, etc.). The processor 220 may obtain the first sample at time:

$$t_{fs} = t_s[n] + m_{min} * \frac{T_{average}[n]}{N} \qquad \text{Eq. 2}$$

where $t_s[n]$ is the last time stamp of the zero crossing of current prior to the event, N is the total number of samples per cycle, $T_{average}[n]$ is derived from equation (1), and $m_{min}$ is the smallest integer number in which $t_f < t_{fs}$ where $t_f$ refers to the time at which the current threshold is exceeded.

The sampling frequency ($f_{samp}$) selected may depend on the period to obtain a given number of samples per cycle.

TABLE 1

Example sampling frequencies($f_{samp}$).

| Frequency range (Hz) | | Period range (ms) | | Sampling frequency for 8 samples per cycle (kHz) | Sampling frequency for 16 samples per cycle (kHz) | Sampling frequency for 32 samples per cycle (kHz) |
|---|---|---|---|---|---|---|
| 64.75 | 65.25 | 15.44 | 15.33 | 0.522 | 1.044 | 2.088 |
| 64.25 | 64.75 | 15.56 | 15.44 | 0.518 | 1.036 | 2.072 |
| 63.75 | 64.25 | 15.69 | 15.56 | 0.514 | 1.028 | 2.056 |
| 63.25 | 63.75 | 15.81 | 15.69 | 0.51 | 1.02 | 2.04 |
| 62.75 | 63.25 | 15.94 | 15.81 | 0.506 | 1.012 | 2.024 |
| 62.25 | 62.75 | 16.06 | 15.94 | 0.502 | 1.004 | 2.008 |
| 61.75 | 62.25 | 16.19 | 16.06 | 0.498 | 0.996 | 1.992 |
| 61.25 | 61.75 | 16.33 | 16.19 | 0.494 | 0.988 | 1.976 |
| 60.75 | 61.25 | 16.46 | 16.33 | 0.49 | 0.98 | 1.96 |
| 60.25 | 60.75 | 16.60 | 16.46 | 0.486 | 0.972 | 1.944 |
| 59.75 | 60.25 | 16.74 | 16.60 | 0.482 | 0.964 | 1.928 |
| 59.25 | 59.75 | 16.88 | 16.74 | 0.478 | 0.956 | 1.912 |
| 58.75 | 59.25 | 17.02 | 16.88 | 0.474 | 0.948 | 1.896 |
| 58.25 | 58.75 | 17.17 | 17.02 | 0.47 | 0.94 | 1.88 |
| 57.75 | 58.25 | 17.32 | 17.17 | 0.466 | 0.932 | 1.864 |
| 57.25 | 57.75 | 17.47 | 17.32 | 0.462 | 0.924 | 1.848 |
| 56.75 | 57.25 | 17.62 | 17.47 | 0.458 | 0.916 | 1.832 |
| 56.25 | 56.75 | 17.78 | 17.62 | 0.454 | 0.908 | 1.816 |
| 55.75 | 56.25 | 17.94 | 17.78 | 0.45 | 0.9 | 1.8 |
| 55.25 | 55.75 | 18.10 | 17.94 | 0.446 | 0.892 | 1.784 |
| 54.75 | 55.25 | 18.26 | 18.10 | 0.442 | 0.884 | 1.768 |

For example, a sampling frequency for a system frequency between 59.75 Hz and 60.25 Hz (i.e., a period of approximately 16.60 ms to 16.74 ms) with 8 samples per cycle may have a sampling frequency of approximately 0.482 khz. While the table provides example sampling frequencies, these are simply meant to be illustrative and any suitable sampling frequency may be used.

The sequence of sampled values at the chosen frequency $\{s_m\}$ may refer to:

$$s_m = s\left[t_{fs} + m\frac{T_{average}[n]}{N}\right] \quad \text{Eq. 3}$$

where m is the integer sample (e.g., m=0, 1, 2, . . . ).

The line sensor 172 may apply a cosine filter to the sample values, via the processor 220 or other filter circuitry, to remove direct current (DC) and harmonic components of the sampled data. The output ($s_{nf}[n]$) of the cosine filter may be given by:

$$s_{nf}[n] = \Sigma_{k=0}^{N-1} c_k s_m[n-k] \quad \text{Eq. 4}$$

where N is the number of samples per cycle, and $c_k$ is the cosine filter coefficients and $\{s_m[n]=0, \forall n<0\}$. The cosine filter coefficient may be selected based on the number of samples per cycle. Below is a table of cosine filter coefficients that may be used. Note that these are simply examples, and the processor 220 may utilize any suitable cosine filter coefficient.

TABLE 2

Example Cosine Filter Coefficients.

| | Cosine Filter Coefficients | | |
|---|---|---|---|
| | 8 samples per cycle | 16 samples per cycle | 32 samples per cycle |
| C0 | 0.9239 | 0.9808 | 0.9952 |
| C1 | 0.3827 | 0.8315 | 0.9569 |
| C2 | -0.3827 | 0.5556 | 0.8819 |
| C3 | -0.9239 | 0.1951 | 0.7730 |
| C4 | -0.9239 | -0.1951 | 0.6344 |
| C5 | -0.3827 | -0.5556 | 0.4714 |
| C6 | 0.3827 | -0.8315 | 0.2903 |
| C7 | 0.9239 | -0.9808 | 0.0980 |
| C8 | — | -0.9808 | -0.0980 |
| C9 | — | -0.8315 | -0.2903 |
| C10 | — | -0.5556 | -0.4714 |
| C11 | — | -0.1951 | -0.6344 |
| C12 | — | 0.1951 | -0.7730 |
| C13 | — | 0.5556 | -0.8819 |
| C14 | — | 0.8315 | -0.9569 |
| C15 | — | 0.9808 | -0.9952 |
| C16 | — | — | -0.9952 |
| C17 | — | — | -0.9569 |
| C18 | — | — | -0.8819 |
| C19 | — | — | -0.7730 |
| C20 | — | — | -0.6344 |
| C21 | — | — | -0.4714 |
| C22 | — | — | -0.2903 |
| C23 | — | — | -0.0980 |
| C24 | — | — | 0.0980 |
| C25 | — | — | 0.2903 |
| C26 | — | — | 0.4714 |
| C27 | — | — | 0.6344 |
| C28 | — | — | 0.7730 |
| C29 | — | — | 0.8819 |
| C30 | — | — | 0.9569 |
| C31 | — | — | 0.9952 |

FIG. 5 shows plot of a resultant signal 360 from applying the cosine filter to the current signal received via the sensor circuitry 200. In the illustrated embodiment, the processor 220 applies the cosine filter to remove a direct current (DC) offset and harmonics in the current signal to generate the resultant signal 360.

The processor 220 may calculate a time of an expected zero crossing ($t_{nzc}$) of current based on the zero crossing time stamps and the period (frequency) before the event 168.

That is, the processor 220 may determine when the next zero crossing would be expected to occur had the event 168 not occurred. For example, the next zero crossing ($t_{nzc}$) may be given by:

$$t_{nzc} = t_s[n] + T_{average}[n] \qquad \text{Eq. 5}$$

where $t_s[n]$ is the last zero crossing of current prior to the event and $T_{average}[n]$ is derived from equation (1). Note that, while zero crossings of current are described in detail in the illustrated embodiment, any suitable feature (e.g., maximum and/or minimum) of the operating parameter (e.g., current and/or voltage) may be used.

The processor 220 may calculate a starting sample ($n_{start}$) of the data to be processed:

$$n_{start} = \text{round}((t_{nzc} - t_f) f_{samp}) \qquad \text{Eq. 6}$$

where $f_{samp}$ is the sampling frequency from Table 1, the round function rounds the resulting value to the nearest integer, $t_{nzc}$ is the next zero crossing from equation (5), and $t_f$ is the time at which the current threshold was exceeded. To identify whether the event is in the same direction 164 or the opposite direction 166 with respect to the reference direction 162, the processor 220 may determine intermediate values X and Y using one of the techniques described below.

FIG. 6 is a flow diagram of a process 380 performed by the processor 220 in accordance with one technique to compute the phase shift between the expected zero crossing and the measured zero crossing using equations (7) and (8) below. As explained above with equation (4), the processor 220 may apply a cosine filter to the sampled data (block 382). The processor 220 may use an approach that determines X and Y using one and ¼ cycles and a data point:

$$Y_1 = s_{nf}[n_{start} + N] \qquad \text{Eq. 7}$$

$$X_1 = s_{nf}\left[n_{start} + N + \frac{N}{4}\right] \qquad \text{Eq. 8}$$

where N is the number of samples per cycle, $s_{nf}$ is the filtered value at the given time from equation (4), and $n_{start}$ is the start of the data to be processed from equation (6). In the illustrated embodiment, the processor 220 may calculate the angle using a ¼ cycle delay in the sample data (block 384). The processor 220 may compute the angle (block 386) based on the $X_1$ and $Y_1$ values.

FIG. 7 is a flow diagram of a process 390 performed by the processor 220 in accordance with another technique to compute the phase shift between the expected zero crossing and the measured zero crossing using equations (10) and (11) below. As explained above, the processor 220 may apply a cosine filter to the sampled data (block 392). The processor 220 may then apply cosine filter coefficients (block 394) and sine filter coefficients (block 396) for the angle computation (block 398):

$$s_{nfp} = s_{nf}[n_{start} + N] \qquad \text{Eq. 9}$$

$$X_2 = \frac{2}{N} \sum_{k=0}^{N-1} Fc_k * s_{nfp}[k] \qquad \text{Eq. 10}$$

$$Y_2 = \frac{2}{N} \sum_{k=0}^{N-1} Fs_k * s_{nfp}[k] \qquad \text{Eq. 11}$$

where $s_{nf}$ is the filtered value at the given time from equation (4), $Fc_k$ are coefficients of cosine, and $Fs_k$ are coefficients of sine, such as the values provided below:

TABLE 3

Example Fc and Fs coefficients

| | Fc coefficients | | | | Fs coefficients | | |
|---|---|---|---|---|---|---|---|
| | 8 samples per cycle | 16 samples per cycle | 32 samples per cycle | | 8 samples per cycle | 16 samples per cycle | 32 samples per cycle |
| Fc0 | 0.9239 | 0.9239 | 0.9952 | Fs0 | −0.3827 | −0.3827 | −0.0980 |
| Fc1 | 0.3827 | 0.3827 | 0.9569 | Fs1 | −0.9239 | −0.9239 | −0.2903 |
| Fc2 | −0.3827 | −0.3827 | 0.8819 | Fs2 | −0.9239 | −0.9239 | −0.4714 |
| Fc3 | −0.9239 | −0.9239 | 0.7730 | Fs3 | −0.3827 | −0.3827 | −0.6344 |
| Fc4 | −0.9239 | −0.9239 | 0.6344 | Fs4 | 0.3827 | 0.3827 | −0.7730 |
| Fc5 | −0.3827 | −0.3827 | 0.4714 | Fs5 | 0.9239 | 0.9239 | −0.8819 |
| Fc6 | 0.3827 | 0.3827 | 0.2903 | Fs6 | 0.9239 | 0.9239 | −0.9569 |
| Fc7 | 0.9239 | 0.9239 | 0.0980 | Fs7 | 0.3827 | 0.3827 | −0.9952 |
| Fc8 | — | 0.9239 | −0.0980 | Fs8 | — | −0.3827 | −0.9952 |
| Fc9 | — | 0.3827 | −0.2903 | Fs9 | — | −0.9239 | −0.9569 |
| Fc10 | — | −0.3827 | −0.4714 | Fs10 | — | −0.9239 | −0.8819 |
| Fc11 | — | −0.9239 | −0.6344 | Fs11 | — | −0.3827 | −0.7730 |
| Fc12 | — | −0.9239 | −0.7730 | Fs12 | — | 0.3827 | −0.6344 |
| Fc13 | — | −0.3827 | −0.8819 | Fs13 | — | 0.9239 | −0.4714 |
| Fc14 | — | 0.3827 | −0.9569 | Fs14 | — | 0.9239 | −0.2903 |
| Fc15 | — | 0.9239 | −0.9952 | Fs15 | — | 0.3827 | −0.0980 |
| Fc16 | — | — | −0.9952 | Fs16 | — | — | 0.0980 |
| Fc17 | — | — | −0.9569 | Fs17 | — | — | 0.2903 |
| Fc18 | — | — | −0.8819 | Fs18 | — | — | 0.4714 |
| Fc19 | — | — | −0.7730 | Fs19 | — | — | 0.6344 |
| Fc20 | — | — | −0.6344 | Fs20 | — | — | 0.7730 |
| Fc21 | — | — | −0.4714 | Fs21 | — | — | 0.8819 |
| Fc22 | — | — | −0.2903 | Fs22 | — | — | 0.9569 |
| Fc23 | — | — | −0.0980 | Fs23 | — | — | 0.9952 |
| Fc24 | — | — | 0.0980 | Fs24 | — | — | 0.9952 |
| Fc25 | — | — | 0.2903 | Fs25 | — | — | 0.9569 |
| Fc26 | — | — | 0.4714 | Fs26 | — | — | 0.8819 |
| Fc27 | — | — | 0.6344 | Fs27 | — | — | 0.7730 |
| Fc28 | — | — | 0.7730 | Fs28 | — | — | 0.6344 |

TABLE 3-continued

Example Fc and Fs coefficients

| | Fc coefficients | | | | Fs coefficients | | |
|---|---|---|---|---|---|---|---|
| | 8 samples per cycle | 16 samples per cycle | 32 samples per cycle | | 8 samples per cycle | 16 samples per cycle | 32 samples per cycle |
| Fc29 | — | — | 0.8819 | Fs29 | — | — | 0.4714 |
| Fc30 | — | — | 0.9569 | Fs30 | — | — | 0.2903 |
| Fc31 | — | — | 0.9952 | Fs31 | — | — | 0.0980 |

In the illustrated embodiment of FIG. 5, $X_2$ of plot 362 may refer to the value of cosine filter coefficients ($Fc_0$-$Fc_7$) at 8 samples per cycle applied to each respective current sample (e.g., samples at $t_0$-$t_7$) of the cycle of the current. Similarly, $Y_2$ of the plot 364 refers to the value of sine filter coefficients ($Fs_0$-$Fs_7$) applied to each respective current sample (e.g., samples at $t_0$-$t_7$) at 8 samples per cycle of the current. Note that the resultant signal and graphs 362 and 364 of coefficients described below may not be to scale and are simply meant to illustrate the steps for determining the directionality of the of the event 168.

The processor 220 may then determine a phase shift between the expected zero crossing and the measured zero crossing of the current based on the intermediate values X and Y (blocks 386 and 398). In an embodiment, the processor 220 may compute the phase shift as:

$$\phi = \operatorname{atan2}(Y_1, X_1) \text{ or} \quad \text{Eq. 11}$$

$$\phi = \operatorname{atan2}(Y_2, X_2) + \frac{\pi}{2} - Ang_{adj} \quad \text{Eq. 12}$$

where $$Ang_{adj} = \frac{2\pi}{N}$$

for N samples per cycle.

The processor 220 may obtain a reference direction in which energy is being delivered to a load. For example, the controller 218 may receive, via the communication circuitry 228, a direction in which power is being delivered from the source 142 to the load 152 and establish the direction in which power is being delivered as the reference direction 162. The processor 220 may determine that the event 168 occurred in the same direction 164 as the reference direction 162 if ϕ is a negative value and determine that the event 168 occurred in the opposite direction 166 of the reference direction 162 if ϕ is a positive value.

Figure 8:
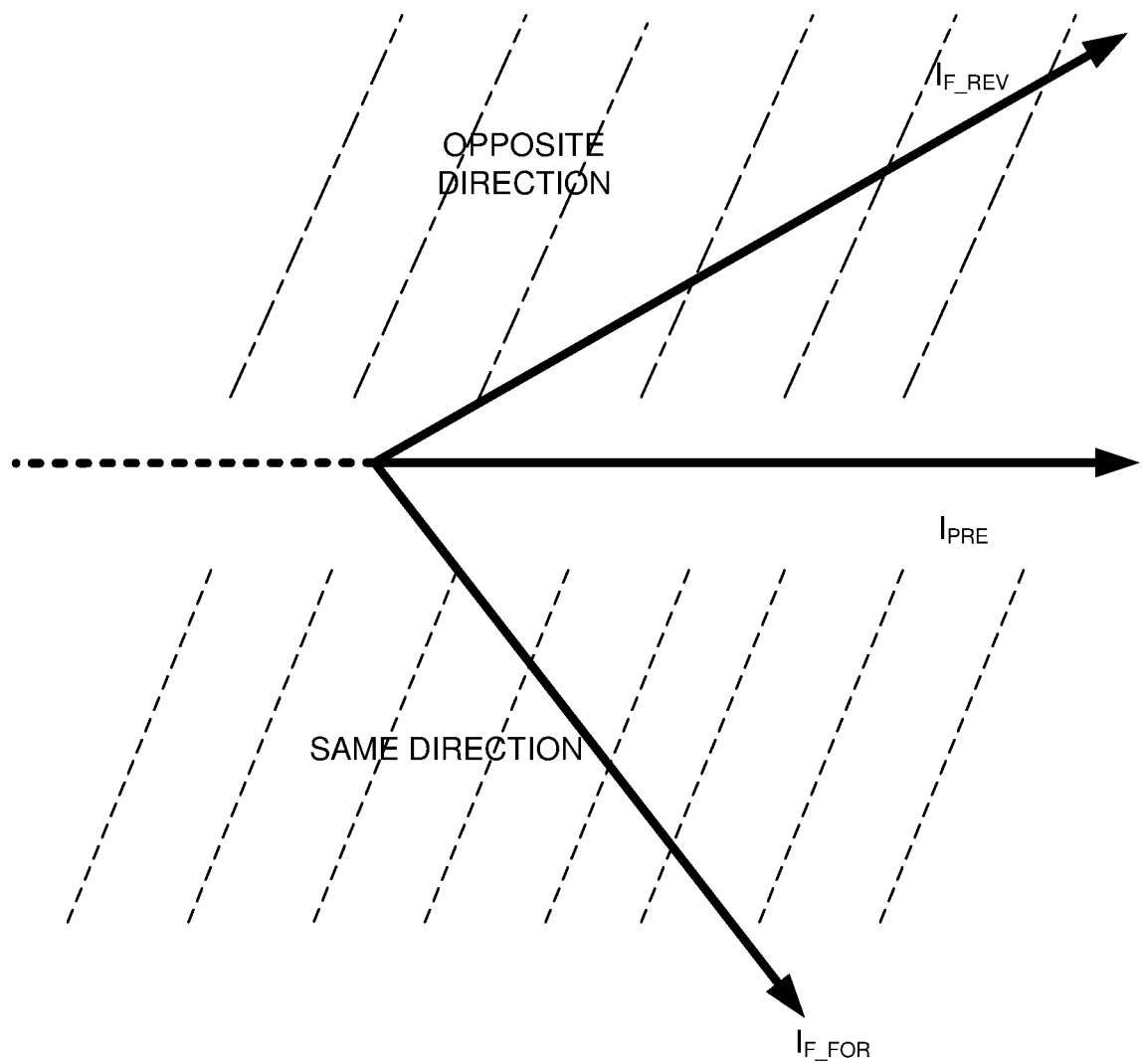
FIG. 8 is a phase diagram of the phase shift between the expected current prior to the event and current measured following the event, in accordance with an embodiment.

FIG. 8 is a phasor diagram that shows relative angles of current during or following an event with respect to pre-event current ($I_{PRE}$). Additionally and/or alternatively, voltage may be used in a similar manner. If the event current is lagging ($I_{F\_FOR}$) the pre-event current (e.g. ϕ is a positive value), the processor 220 may determine that the event occurred or is occurring in the same direction 164 as the reference direction 162. When the event current leads ($I_{F\_REV}$) the pre-event current (e.g., ϕ is a negative value), the processor 220 may determine that the event occurred in the opposite direction 166 of the reference direction 162.

The systems and methods described herein improve line sensor technology by determining directionality of events such that outage times in power transmission and distribution systems are reduced, thereby improving operation of the power transmission and distribution system. For example, the line sensor may send an output signal indicative of the direction to a relay to cause the relay to open based on the direction. For example, the line sensor may cause a relay to open a circuit breaker due to the line sensor determining that the fault is in the same direction as a reference direction. Further, the line sensor may provide a visual indication or an auditory indication of the 'direction to enable an operator to locate the event based on the direction faster than if no direction were available. By adding the additional functionality of determining a relative direction of an event to the power transmission and distribution system, the line sensor may reduce down time of a power system due to events. Moreover, by adding the functionality of providing directionality of an event without continuous or repeated sampling of current during normal operations (e.g., pre-event), line sensor technology may be improved by reducing power consumption.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A line sensor for a power line, comprising:
sensor circuitry comprising:
phase detection circuitry configured to:
detect a feature of an operating parameter of the power line prior to an occurrence of an event; and
send an activation signal to activate a controller upon detecting the feature; and
threshold detection circuitry configured to, upon detecting the occurrence of the event, send an event signal to the controller;

the controller, comprising:
- at least one memory; and
- a processor operatively coupled to the at least one memory, wherein, the processor is configured to:
  - upon receiving the activation signal, store a time stamp associated with the feature;
  - upon receiving the event signal, measure samples of the operating parameter; and
  - determine a relative direction of the event on the power line with respect to a reference direction of an expected measurement of the operating parameter based at least in part on the time stamp and the measured samples of the operating parameter.

2. The system of claim 1, wherein the operating parameter comprises current or voltage of the power line.

3. The system of claim 1, wherein the feature comprises a zero crossing of the operating parameter.

4. The system of claim 3, wherein the phase detection circuitry is configured to send the activation signal upon detecting a zero crossing of current.

5. The system of claim 1, wherein the threshold detection circuitry comprises:
- a rectifier; and
- a comparator electrically coupled to an output of the rectifier, wherein the comparator is configured to compare the current of the rectifier to a threshold current and to output the event signal to the controller when the current exceeds the threshold current.

6. The system of claim 1, wherein the controller is configured to be inactive during the pre-event mode and to be active during the event mode.

7. The system of claim 1, wherein the processor is configured to determine an expected feature of the operating parameter based at least in part on the time stamp.

8. The system of claim 7, wherein the processor is configured to determine the relative direction by determining a phase shift between the expected feature and a measured feature from the measured samples.

9. The system of claim 1, wherein, to conserve power, the processor is configured to deactivate upon storing the time stamp until receiving another activation signal or the event signal.

10. The system of claim 1, wherein the controller is configured to operate in a pre-event mode prior to receiving the event signal and to operate in an event mode upon receiving the event signal, wherein the pre-event mode utilizes less power than the event mode.

11. A tangible, non-transitory computer-readable medium comprising instructions configured to be executed by a processor of a line sensor on a power line, wherein the instructions are configured to cause the processor to:
- retrieve a plurality of times, wherein each time of the plurality of times is associated with a respective zero crossing of an operating parameter of the power line prior to an event;
- determine a period based on the plurality of times;
- measure samples of the operating parameter upon detection of the event;
- determine an expected zero crossing based at least in part on the period;
- provide an indication of a relative direction of the event on the power line with respect to a reference direction of an expected measurement of the operating parameter based at least in part on the expected zero crossing and the measured samples of the operating parameter.

12. The non-transitory, computer-readable medium of claim 11, comprising instructions configured to cause the processor to apply a filter to the samples to reduce or remove a DC component, a harmonic component, or both, from the samples.

13. The non-transitory, computer-readable medium of claim 11, comprising instructions configured to cause the processor to determine the period based on a moving average of times of zero crossings.

14. The non-transitory, computer-readable medium of claim 11, comprising instructions configured to cause the processor to detect an overcurrent, an undercurrent, an undervoltage, an overvoltage, a loss of current, or any combination thereof to detect an occurrence of the event.

15. The non-transitory, computer readable medium of claim 11, comprising instructions configured to cause the processor to determine a start of data to process as:

$$n_{start} = \text{round}((t_{nzc} - t_f)f_{samp})$$

where $t_{nzc}$ is the expected zero crossing, $t_f$ is a time at which the event was detected, and $f_{samp}$ is a sampling frequency of the samples.

16. The non-transitory, computer readable medium of claim 15, comprising instructions configured to cause the processor to determine a data point (X1, Y1):

$$Y_1 = s_{nf}[n_{start} + N]$$

$$X_1 = s_{nf}\left[n_{start} + N + \frac{N}{4}\right]$$

where N is a number of samples measured in a cycle of the operating parameter and $s_{nf}$ is an output of a cosine filter that removes direct current (DC) and harmonic components of the samples.

17. The non-transitory, computer readable medium of claim 16, comprising instructions configured to cause the processor to calculate a phase shift as:

$$\phi = a\tan 2(Y_1, X_1)$$

wherein, when the phase shift is positive, the relative direction of the event is in the opposite direction of a reference direction, and when the phase shift is negative, the relative direction of the event is in the same direction as the reference direction.

18. The non-transitory, computer readable medium of claim 11, comprising instructions configured to cause the processor to apply cosine a filter coefficient to each respective sample over a cycle to determine $X_2$, and to apply sine filter coefficients to each respective sample over the cycle to determine $Y_2$.

19. The non-transitory, computer-readable medium of claim 18, comprising instructions configured to cause the processor to compute the phase shift as:

$$\phi = \text{atan2}(Y_2, X_2) + \frac{\pi}{2} - Ang_{adj}$$

where $\phi$ is the phase shift $$Ang_{adj} = \frac{2\pi}{N}$$

for N samples per cycle, and wherein when the phase shift is positive, then the relative direction of the event is in the opposite direction of a reference direction, and when the phase shift is negative, the relative direction of the event is in the same direction as the reference direction.

20. The non-transitory, computer-readable medium of claim 11, comprising instructions configured to cause the processor to obtain a reference direction via a communication circuitry of the line sensor.

21. A wireless line sensor for a power line, comprising:
sensor circuitry communicatively coupled to the power line to detect an operating parameter of the power line, wherein the sensor circuitry is configured to, upon detecting an occurrence of an event, send an event signal to a controller; and
the controller comprising:
at least one computer-readable storage media;
a processor operatively coupled to the at least one computer-readable storage media, wherein the processor is configured to:
determine an expected time at which a feature of the operating parameter is expected to occur;
measure samples of the operating parameter upon occurrence of the event;
determine a relative direction in which the event occurred on the power line with respect to a reference direction of an expected measurement of the operating parameter based at least in part on the expected time and the measured samples.

22. The wireless line sensor of claim 21, comprising power harvesting circuitry configured to harvest power to power the wireless line sensor without being directly electrically coupled to any power grid.

23. The wireless line sensor of claim 22, wherein the power harvesting circuitry is configured to receive power via a current transformer of the wireless line sensor.

24. The wireless line sensor of claim 21, wherein the sensor circuitry is configured to send the activation signal when the operating parameter exceeds a threshold.

25. The wireless line sensor of claim 21, comprising phase detection circuitry configured to provide times at which the feature previously occurred.

* * * * *